Figure 1:
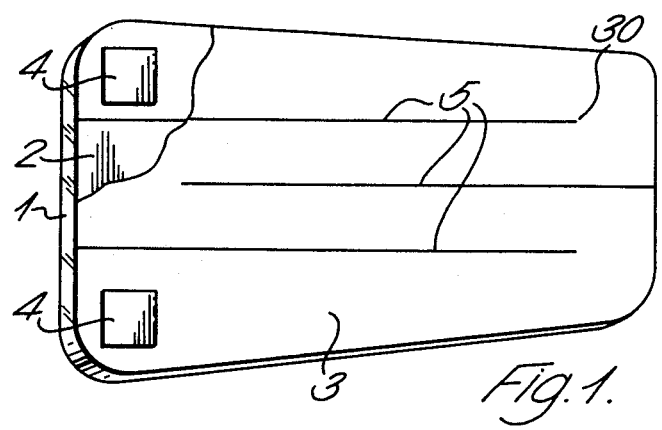

United States Patent [19]

Smallbone

[11] 4,251,316

[45] Feb. 17, 1981

[54] METHOD OF MAKING HEATED MIRRORS

[75] Inventor: Robert A. Smallbone, Bognor Regis, England

[73] Assignee: Britax (Wingard) Limited, Chichester, England

[21] Appl. No.: 71,049

[22] Filed: Aug. 30, 1979

Related U.S. Application Data

[63] Continuation of Ser. No. 847,095, Oct. 31, 1977, abandoned.

[30] Foreign Application Priority Data

Nov. 15, 1976 [GB] United Kingdom ............... 47454/76

[51] Int. Cl.³ ..................... B44C 1/22; C03C 15/00; C03C 25/06; C23F 1/02
[52] U.S. Cl. ..................... 156/634; 29/842; 29/846; 156/645; 156/656; 219/219; 427/96; 427/271; 427/282
[58] Field of Search ............... 219/219; 338/308, 309; 156/629–634, 645, 656, 659, 101; 29/625, 628, 630 R, 611, 829, 835, 842, 846, 857; 427/96, 125, 102, 271, 287, 289

[56] References Cited

U.S. PATENT DOCUMENTS

| 2,850,409 | 9/1958 | Boicey et al. ............... 134/41 UX |
| 2,944,926 | 7/1960 | Gaiser ............................. 156/101 X |
| 3,164,716 | 1/1965 | Schenker et al. ............... 29/829 X |
| 3,427,712 | 2/1969 | Witdoeckt ..................... 29/611 |
| 3,553,833 | 1/1971 | Jochim et al. ................. 29/611 |
| 3,714,709 | 2/1973 | Liederbach ................... 29/829 X |
| 3,798,419 | 3/1974 | Maake ........................... 219/219 X |
| 3,978,249 | 8/1976 | Cooke ............................ 427/99 |
| 4,016,645 | 4/1977 | Cooke ............................ 29/611 |

Primary Examiner—William A. Powell
Attorney, Agent, or Firm—Diller, Ramik & Wight

[57] ABSTRACT

A method of producing a heated mirror by selective removal of conductive reflective material from an insulating substrate to define a conductive path with a predetermined resistance. The conductive reflective material can be removed by scoring down to the substrate or by scoring and etching. Conductive paths are defined by tracks in a serpentine, spiral or interleaved comb pattern. Isolated regions may be left to designate a Trade Name which is visible when the mirror is demisted. Different insulating backings and terminals are also described.

23 Claims, 14 Drawing Figures

METHOD OF MAKING HEATED MIRRORS

This is a continuation of application Ser. No. 847,095 filed Oct. 31, 1977, now abandoned.

This invention relates to heated mirrors and methods of making the same.

A heated mirror is useful in conditions where water vapour may condense on its surface to obscure the view. Typical fields of use are vehicle rear mirrors, which can be demisted or defrosted, and bathroom mirrors which are heated to reduce or eliminate condensation.

In the case of vehicle rear view mirrors, it is known to provide a heating element in a casing which supports a mirror, but this method leads to high manufacturing costs. It is also known to deposit a reflective layer in the form of a resistive path on a sheet of glass, the resistive path being applied by film evaporation or sputtering of nickel-chromium alloy. However, this requires special techniques leading to high costs of manufacture.

The present invention seeks to avoid these problems and, at least in its preferred embodiments, to provide a low cost heated mirror without the need to use any special reflective material.

In its broadest aspect, the present invention provides a method of producing a heated mirror comprising the steps of providing a layer of conductive reflective material on an insulating substrate and of selectively removing some of the reflective material to define a conductive path having a predetermined resistance.

For example, the reflective material may be a backing of silver on a glass substrate, the reflective surface being viewed through the glass. By way of an alternative example, the reflective material may be chromium deposited on an insulating substrate and viewed directly.

When using a reflective material (such as silver) which is deposited on a transparent, insulating substrate (such as glass), with the reflective surface viewed through the substrate, the backing layer of reflective material may be protected by a coating of copper which is itself protected by a coating of paint and/or plastics. After selectively removing some of the reflective material to form the conductive path, a plastics layer may be applied in the form of an adhesive sheet, this having the advantage of retaining splinters in the event of breaking a glass substrate. Alternatively, after said selective removal of reflective material, paint may be applied over the entire substrate, or over regions corresponding to those where the reflective material has been removed. For example, where the conductive paths are defined by elongated gaps between regions of reflective material, strips of paint may be applied over said gaps, the paint strips being wider than the gaps.

Preferably, the step of selectively removing some of the reflective material comprises scoring the layer of reflective material, or an insulating layer on said reflective material, or both. In the case of a relatively soft reflective material, the scoring is such as to produce lines deep enough to reach the insulating substrate. A relatively harder and possibly thicker reflective material may necessitate etching to achieve said selective removal, the etching being effected either with or without previously scoring the layer of reflective material and/or a covering layer of insulating material.

The scoring process is preferably carried out soon after the reflective material, or the reflective material and an insulating backing layer have been applied to the substrate. For example, a silver and paint backing layer on a glass substrate age quickly after a mirror is produced, the layers becoming harder thereby making it more difficult to produce the heated mirror simply by scoring. If such mirrors are left for too long a period, etching and scoring may be required to give reliable results. In a typical example, mirrors employing a layer of silver and paint on a glass substrate were scored within a few days of laying down the silver and paint layers on the glass, i.e. (within 1–4 days).

A useful scoring or cutting tool is a lathe tool bit having a tool point radius of substantially 12–25 $\mu$m (0.0005–0.001"). The tool point radius will depend on the nature of the pattern required to form a conductive path with a predetermined resistance. For example, straight paths may be cut with a tool point radius which is less than that used for curved paths. The cutting or scoring pressure is suitably regulated by an adjustable spring tension device so that the tool point cuts through the layer of reflective material, or insulating covering layer or both, without scratching the insulating substrate. This is particularly important when the substrate is glass, to avoid subsequent breakage. The relative cutting speed between the tool and the substrate may depend on the materials used, but typically a speed of about 0.3 meters/seconds (60 ft/minute) can be used with glass mirrors.

In a batch process, it is preferable to ensure that all mirrors of the same type have the same heat dissipation. Therefore, it may be necessary to measure the thickness of the reflective material and to select a pattern and length of conductive path to produce consistent results for mirrors in the same production batch. For example, the silver thickness on the glass mirrors may be measured electronically, for example, by means of an inductive head placed against one of the major surfaces of the mirror. The inductive head may be part of a balancing bridge circuit. Usually, a choice of two patterns or lengths of conductive path are all that is required to ensure that thick silver coatings (exceeding 0.08 $\mu$m) produce a similar heat output in the finished mirror as with a thin coating (less than 0.08 $\mu$m). A thick silver coating may require etching as well as scoring.

The selective removal of the reflective material may leave elongate gaps defining serpentine, spiral, or interleaved comb patterns. Elongated gaps are preferably covered by a layer or elongated strips of paint or plastics to prevent the entry of water or other corrosive agents.

The conductive path may be continuous to form a single resistive track, or it may be formed in more than one part by parallel connected paths. Usually, terminals are connected to the ends of the series or parallel connected paths so as to provide the heating current. A third intermediate terminal, connected midway, or part of the way along the conductive path or paths, is useful in making a series/parallel arrangement for dual voltage supply, or providing a tapped voltage for an indicator lamp such as an LED or for providing a tapped voltage to operate other electrical remote control systems on a vehicle which may need, for example, a centre tapped power supply.

When copper and paint layers are applied to a reflective backing layer, the paint layer may be selectively removed at points which define terminals for the conductive path. According to one embodiment, the paint layer is removed and copper is deposited in its place. A plastics film is then applied and electrical connections are made by means of a clamp having teeth which pierce the plastics film and enter the deposit of copper. Alternatively, terminal connections may be made by masking a silvered substrate and depositing copper in regions not covered by the mask. These regions may be in the form of strips which extend beyond the scored outline of the mirror in a sheet of glass, the extended portions being peeled from the waste glass when the mirror is broken out from the sheet. Press-stud terminals may also be soldered to regions of copper forming terminals for the conductive path, this facilitating installation of a rear view mirror in a vehicle. Alternatively, to avoid soldering, a flat contact made, for example, of soft brass, could be attached to the reflective material by means of an insulating backing layer or a conductive adhesive, the backing layer being pierced to raise a part of the contact away from the major surface of the mirror.

The reflective material may be selectively removed from the substrate to form an isolated region which is not heated by current passing through said conductive path. Such isolated regions may be bounded by respective and continuous score lines or they may be regions where all of the reflective material is removed. Such isolated regions may form a pattern designating a trade name which is visible as the mirror is, for example, demisted. However, such isolated regions may also be provided to reduce or avoid hot spots in predetermined areas on the substrate. In particular, the end of a score line may be continued to form a closed loop to avoid a hot spot in this area. This is because the temperatures achieved at score line terminations have been found to be higher than elsewhere. However, it is preferred that the conductive path forms a spiral pattern to give a more uniform temperature distribution.

The present invention also provides mirrors produced according to the method and having preferred features as described above. Such mirrors may be provided with temperature control means for regulating the temperature of the reflective material. Such control means may comprise a resistor attached to the substrate and having a positive coefficient of resistance whereby the resistance increases with temperature to regulate the current supplied to said conductive path.

Figure 2:
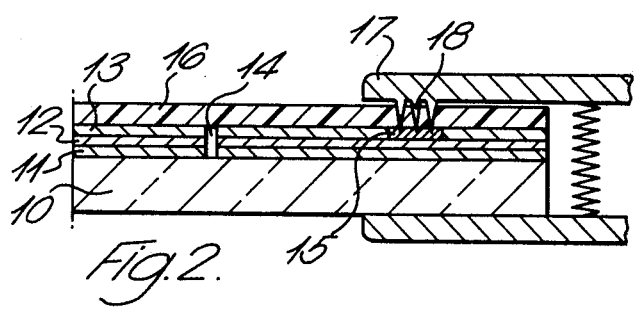
Figure 3:
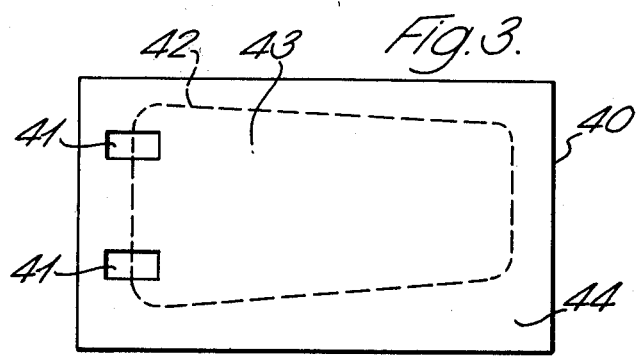
Figure 7:
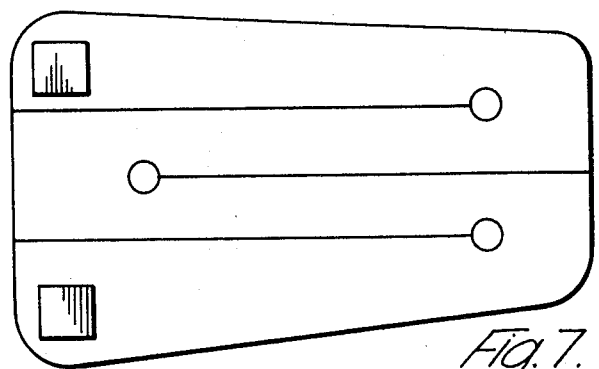
Figure 8:
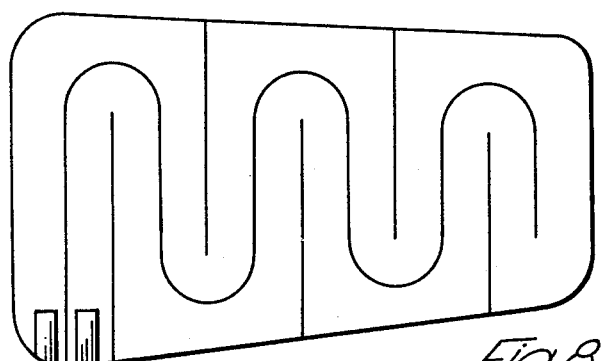
Figure 9:
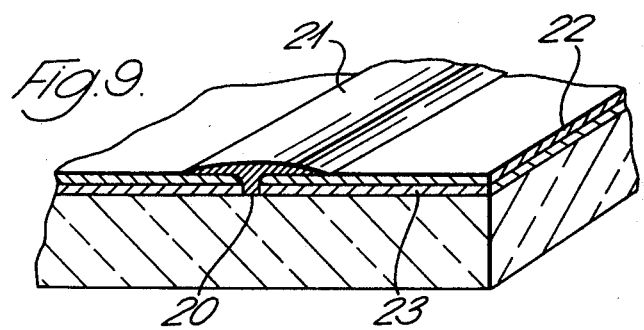
Figure 10:
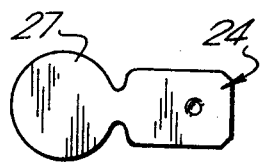
Figure 11:
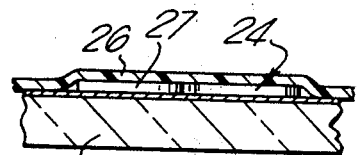
Figure 12:
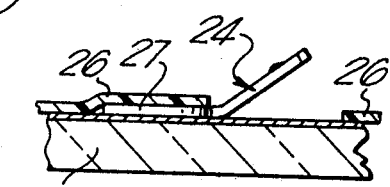
Figure 13:
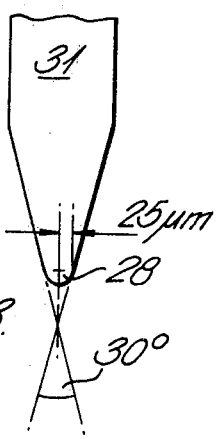
Figure 14:
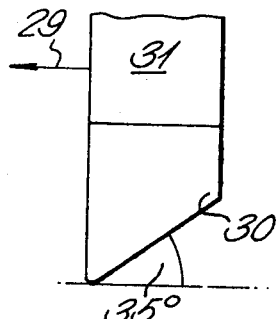

Embodiments of the invention will now be described with reference to the accompanying schematic drawings, in which:

FIG. 1 is a partly broken away view of a heated mirror according to one embodiment of the invention, FIG. 2 is a section through part of a heated mirror showing one form of electrical connection means, FIG. 3 is a diagram for explaining a technique of forming terminals on a reflective surface, FIGS. 4-8 illustrate different patterns of conductive paths and/or isolated regions on respective mirrors, FIG. 9 illustrates a part of the mirror and shows an insulating strip overlying a gap between conductive paths, FIG. 10 is a plan view of a terminal, FIGS. 11 and 12 are sectional views through part of a mirror illustrating how the terminal of FIG. 10 is fitted and used, and FIGS. 13 and 14 are views, on different elevations, of a tool bit used for scoring lines to define conductive paths.

Referring to FIG. 1, a sheet of glass 1 has a coating of silver protected by a coating of copper 2. The copper coating is protected by a layer of paint 3 which is shown partly cut away. A small area of paint is scraped away to reveal the copper surface and a copper terminal 4 is plated onto the copper surface. Wire leads can then be soldered to the terminals 4. A number of lines 5 are scored on the rear surface, the lines being deep enough to remove the copper and silver from the glass substrate so that the reflective surface is defined by a conductive path having a tortuous path between terminals 4. We have found that by applying about 12 volts across the terminals, the mirror temperature rises sufficiently to disperse condensation.

Instead of using a layer of silver, a layer of chromium may be deposited on an insulating substrate to form a reflective surface which is viewed directly. In this case, the substrate need not be transparent. The chromium may be deposited on a copper coating or some other compatible intermediate layer. The chromium layer may also be protected by a transparent layer.

In the case of the mirror described with reference to FIG. 1, a sheet of adhesive plastics material may be applied over the coating of paint both to retain splinters if the glass substrate 1 breaks and to prevent the entry of water and other corrosive agents into the score lines which may damage the reflective surface. However, other forms of plastic backing may also be employed.

FIG. 2 illustrates a section through a heated mirror and through means for making an electrical connection with the conductive path. A glass substrate 10 has a layer of silver 11, a layer of copper 12 and a layer of paint 13. Reference numeral 14 designates a score line defining a conductive path in the layer of silver 11. Reference numeral 15 represents a body of copper which is deposited in a space made by scraping away the paint coating to uncover the copper layer in a proposed terminal region. The deposit of copper and the score lines 14, are covered by a film of plastics 16. Electrical connection is made by means of a clamp 17 having teeth 18 which pierce through the plastics film 16 and enter the copper terminal pad 15.

FIG. 3 is a diagram for explaining another technique of making terminal connections. A piece of silvered glass 40 is masked with material having apertures 41 and copper is electroplated onto the silver revealed by the apertures. The glass is then scored, by means of a glass cutter, on the non-silvered side along line 42 to define the required shape of the mirror 43. The mirror 43 is then broken out of the sheet and the copper which bridges a score line is peeled from the waste glass 44. Thus, a pair of tags are available for connection to external circuitry.

Score lines such as those shown at 5 in FIG. 1 or 14 in FIG. 2 can be made either before or after protective painting.

The score lines can be provided in configurations other than those shown in FIG. 1. For example, selective demisting can be achieved by making part of the current path wider or narrower as described. Also, a required value of current can be selected by appropriate positioning of the score lines defining the conductive path. The mirrors shown in FIGS. 4 and 5 are examples of this.

Figure 4:
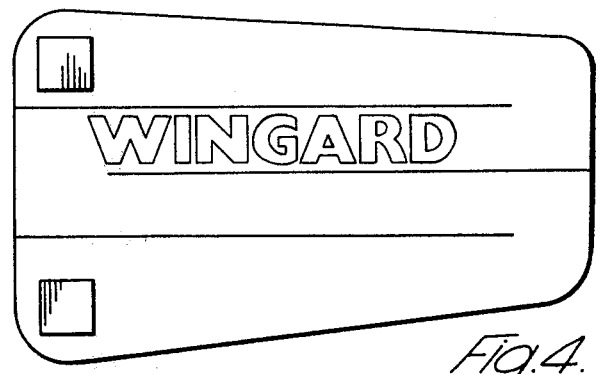

In the embodiment of FIG. 4, isolated regions enclosed by score lines define the name WINGARD (Registered Trade Mark) and these regions are not subjected to heating by electric current. Therefore, when the mirror is demisted the isolated regions correspond to regions of condensation and depict the name WIN- GARD (Registered Trade Mark) which can be seen by the user.

Figure 5:
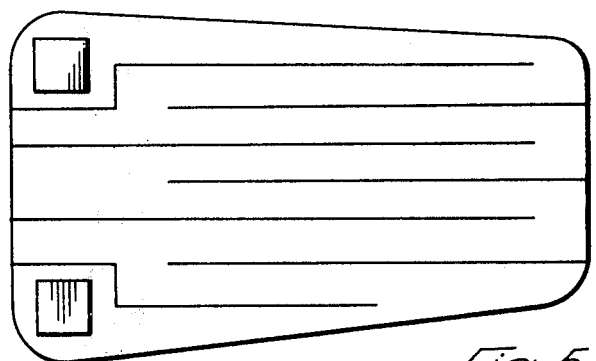

FIG. 5 shows a score pattern which limits the current and therefore the power available for heating the reflective surface.

Figure 6:
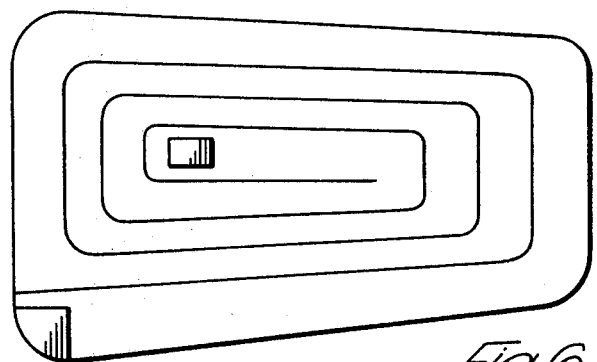

FIG. 6 shows a score line in a spiral pattern and FIG. 8 shows score lines in a serpentine pattern and extending from one edge across the surface of the mirror. As the temperatures reached at score line terminations (for example, 30 in the mirror of FIG. 1) are higher than elsewhere, the score lines may be continued to form loops as shown in the embodiment of FIG. 7. However, a spiral pattern is preferred to give a more uniform temperature.

Referring to FIG. 9, it is not necessary to re-paint the whole of the mirror back after scoring a track or line 20, as a ribbon 21 of paint placed centrally over the track 20, and of a wider dimension, will suffice. For example, with a track 20 cut by the tools shown in FIG. 13 or 14, a ribbon of paint 2.5 mm was found to be suitable. Use of strips of paint eliminates paint overspray, reduces paint consumption, and keeps contacts (not shown) free of paint which are connected to a copper layer 22 over the reflective layer 23.

Referring to FIGS. 10-12, a flat soft brass contact 24 may be attached to the reflective layer or a copper layer on the substrate 25 by means of a conductive adhesive. As shown in FIG. 11, the contact 24 lays flat against the back of the mirror 25 and is covered by a sheet of plastics material and/or a layer of insulating paint. The selective removal of backing paint from areas adjacent any contact 24 can be achieved by applying a paint stripping liquid through respective apertures in a printing screen mask and removing the softened paint in said areas with a solvent such as ethyl alcohol. When the contact 24 is required for connection to the electrical circuit of the vehicle, the plastics sheet 26 is selectively removed, as shown in FIG. 12 so that the spade shaped terminal end of the contact may be lifted away from the major surface of the mirror. The circular portion 27 of contact 24 is attached to the reflective layer or copper backing layer by means of the conductive adhesive.

As a copper/silver alloy reflective coating has a positive temperature coefficient, thermostatic control may not be required in a heated mirror fitted to a vehicle. For example, on raising the temperature of a sample to 200° F., its resistance increased from 7.5 to 8.5 ohms with an ambient temperature of 70° F.

Referring to FIGS. 13 and 14, this illustrates a lathe tool bit which is useful in scoring lines to define the conductive path. With interleaved comb patterns, ganged tool bits can be advantageously used to provide simultaneous parallel score lines. Each tool requires its cutting pressure to be regulated by an adjustable spring tension device. With a glass substrate, the pressure is such as to cut through the reflective material and its backing layer without scoring the glass. The pressure at which the glass will score or break depends mainly on the tool point radius which should be of the order of 25 μm (0.001") for straight lines. FIG. 13 shows the tool point radius 28 and the included angle of 30° of the tool cutting faces. FIG. 14 shows the trailing angle of 35°, in an elevation at right angles to FIG. 13, the direction of cutting being indicated by arrow 29. When cutting glass mirrors, a depth limit stop (not shown) is required to prevent the heel 30 of the tool bit 31 from smashing the edge of the glass when the tool point leaves the substrate.

When cutting a spiral or curve, a plain point may be used as turning the tool into the cut when rounding a curve may result in expensive jigging. The tool point will be part of a sphere having a radius of between 12 to 50 μm (0.0005-0.002"). The included angle (as shown in FIG. 13) of the tool point should be between 20°-30°.

Some mirrors may have a reflective layer or silvering which requires to be etched as well as scored to ensure that all of the reflective material is removed to define the track between conductive paths. A suitable etching solution comprises the following constituents:

Ammonium chloride 11 Kg
Copper Sulphate 4.5 Kg
Water 200 liters

A hot water rinse is then required.

Mirrors made by Verres Hertz nearly always require the above etching. The silver is opaque and about 0.001 mm thick. Mirrors produced by the Applicant company do not require etching. These mirrors have a backing paint which is known by the Trade name TAFF MOD the paint being made by Pearl Paints Limited, Treforest Industrial Estate, Glamorganshire. The silver thickness is about 0.6 μm.

What we claim is:

1. A method of producing a heated mirror comprising the steps of silvering a layer of electrically conductive reflective silvering directly upon a rear surface of an electrically insulating glass substrate to form a unitized laminate having a reflective surface as viewed through the glass substrate, scoring a line completely through the layer of silvering to the glass substrate to electrically insulate portions of the conductive material on opposite sides of the resulting through scoreline from each other whereby resultant conductive portions define a predetermined electrically conductive path, and subsequently covering at least the through scoreline with insulating material to provide an environmental seal.

2. The method as defined in claim 1 including the step of removing selective areas of the silvering from at least one of the conductive portions through to the glass substrate to define indicia which becomes visible when the mirror is demisted by passing a current through the electrically conductive path.

3. A method of producing a heated mirror comprising the steps of forming a unitized laminate from a layer of electrically conductive reflective material and an electrically insulating substrate, scoring a line completely through the layer of conductive material to the insulating substrate to electrically insulate portions of the conductive material on opposite sides of the resulting through scoreline from each other whereby the conductive portions define a predetermined electrically conductive path, subsequently covering at least the through scoreline with insulating material to provide an environmental seal, utilizing a conductive adhesive to electrically connect a terminal to at least one of the conductive portions, and covering the terminal with a sheet of insulating material adhesively bonded to the conductive material.

4. The method as defined in claim 3 including the step of removing a portion of the sheet of insulating material to expose at least a portion of the terminal and permit the latter to be manipulated through the removed portion to form an electric connection.

5. The method as defined in claim 1 wherein the laminate is of an initial predetermined peripheral outline and the mirror formed therefrom is of a smaller final peripheral outline than the initial predetermined peripheral outline, the method further including the step of depositing further conductive material upon an area of the layer of silvering in bridging relationship to the final peripheral outline and the through scoreline, forming the mirror to the final peripheral outline, and peeling from the laminate outboard of the final peripheral outline that portion of the further conductive material thereon.

6. The method as defined in claim 1 including the step of attaching a resistor to the substrate having a positive coefficient of resistance which increases with temperature for regulating the current supplied to the conductive path.

7. The method as defined in claim 1 wherein the scoring step is performed one to four days after the step of forming the unitized laminate.

8. The method as defined in claim 1 including the step of removing any extraneous silvering remaining in the through scoreline after the scoring step by etching within the through scoreline.

9. The method as defined in claim 5 wherein the depositing step is performed by masking the layer of silvering except in the area upon which the further conductive material is deposited.

10. The method as defined in claim 2 including the steps of utilizing a conductive adhesive to electrically connect a terminal to at least one of the conductive portions, and covering the terminal with a sheet of insulating material adhesively bonded to the conductive material.

11. The method as defined in claim 2 including the steps of utilizing a conductive adhesive to electrically connect a terminal to at least one of the conductive portions, covering the terminal with a sheet of insulating material adhesively bonded to the silvering, and removing a portion of the sheet of insulating material to expose at least a portion of the terminal and permit the latter to be manipulated through the removed portion to form an electric connection.

12. The method as defined in claim 2 wherein the laminate is of an initial predetermined peripheral outline and the mirror formed therefrom is of a smaller final peripheral outline than the initial predetermined peripheral outline, the method further including the step of depositing further conductive material upon an area of the layer of silvering in bridging relationship to the final peripheral outline and the through scoreline, forming the mirror to the final peripheral outline, and peeling from the laminate outboard of the final peripheral outline that portion of the further conductive material thereon.

13. The method as defined in claim 5 including the step of removing an extraneous silvering remaining in the through scoreline after the scoring step by etching within the through scoreline.

14. A method of producing a heated mirror comprising the steps of depositing a layer of electrically conductive reflective material upon a rear surface of a transparent substrate formed of electrical insulating material to form a unitized laminate therefrom through which a reflective surface of the layer can be viewed through the transparent substrate, scoring a line completely through the reflective material layer to the substrate to expose the substrate through the thus formed through scoreline and to further thereby electrically insulate portions of the conductive material from each other across and on opposite sides of the through scoreline whereby the resultant conductive portions define predetermined electrically conductive paths each at least in part set-off by the through scoreline, and after the scoring step covering at least the through scoreline with insulating material to provide an environmental seal.

15. The method as defined in claim 14 wherein the scoring step is performed by utilizing a tool having a rounded scoring radius which is brought into pressure bearing engagement with and movable relative to the reflective material layer.

16. The method as defined in claim 14 including the step of etching the electrically conductive layer within the area of the through scoreline to remove therefrom extraneous conductive material remaining after the performance of the scoring step.

17. The method as defined in claim 15 including the step of etching the electrically conductive layer within the area of the through scoreline to remove therefrom extraneous conductive material remaining after the performance of the scoring step.

18. A method of producing a heated mirror comprising the steps of depositing a layer of electrically conductive reflective material upon a rear surface of a transparent substrate formed of electrical insulating material and another layer of protective material upon the reflective material layer to form a unitized protective layer/electrically conductive reflective layer/electrically insulating substrate laminate therefrom through which a reflective surface of the reflective layer can be viewed through the transparent substrate, simultaneously scoring a line completely through both the protective layer and the reflective material layer to the substrate to expose the substrate through the thus formed through scoreline and to further thereby electrically insulate portions of the conductive material from each other across and on opposite sides of the through scoreline whereby the resultant conductive portions define predetermined electrically conductive paths each at least in part set-off by the through scoreline, and after the scoring step covering the through scoreline and at least a portion of the protective layer with insulating material to provide an environmental seal.

19. The method as defined in claim 18 wherein the scoring step is performed by utilizing a tool having a rounded scoring radius which is brought into pressure bearing engagement with and movable relative to the protective layer and scores through the protective layer and the conductive layer generally simultaneously.

20. The method as defined in claim 18 including the step of etching the electrically conductive layer within the area of the through scoreline to remove therefrom extraneous conductive material remaining after the performance of the scoring step.

21. The method as defined in claim 18 wherein the protective layer is formed of electrically insulating material.

22. The method as defined in claim 19 including the step of etching the electrically conductive layer within the area of the through scoreline to remove therefrom extraneous conductive material remaining after the performance of the scoring step.

23. The method as defined in claim 22 wherein the protective layer is formed of electrically insulating material.

* * * * *